(12) United States Patent
Schreiber et al.

(10) Patent No.: US 10,541,013 B1
(45) Date of Patent: Jan. 21, 2020

(54) HEADERLESS WORD LINE DRIVER WITH SHARED WORDLINE UNDERDRIVE CONTROL

(71) Applicant: Advanced Micro Devices, Inc., Santa Clara, CA (US)

(72) Inventors: Russell J. Schreiber, Austin, TX (US); Tawfik Ahmed, Austin, TX (US); Ilango Jeyasubramanian, Austin, TX (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 0 days.

(21) Appl. No.: 16/189,185

(22) Filed: Nov. 13, 2018

(51) Int. Cl.
*G11C 8/18* (2006.01)
*G11C 8/08* (2006.01)
*G11C 11/408* (2006.01)
*G11C 11/418* (2006.01)

(52) U.S. Cl.
CPC ............ *G11C 8/08* (2013.01); *G11C 11/4085* (2013.01); *G11C 11/418* (2013.01)

(58) Field of Classification Search
CPC ...... G11C 8/08; G11C 11/4085; G11C 11/418
USPC .................................................. 365/230.06
See application file for complete search history.

(56) References Cited

U.S. PATENT DOCUMENTS

| 7,570,525 | B2* | 8/2009 | Nii ........................... G11C 8/08 365/189.11 |
| 8,164,964 | B2* | 4/2012 | Chandra ............... G11C 11/413 365/194 |
| 9,064,550 | B2* | 6/2015 | Chang ...................... G11C 8/08 |
| 2007/0030741 | A1* | 2/2007 | Nii ........................... G11C 8/08 365/189.11 |
| 2011/0063932 | A1* | 3/2011 | Chandra .................. G11C 8/08 365/194 |
| 2013/0100730 | A1* | 4/2013 | Chang ................... G11C 11/418 365/154 |
| 2015/0029799 | A1 | 1/2015 | Schreiber |
| 2016/0049191 | A1 | 2/2016 | Siddiqui et al. |
| 2018/0261278 | A1 | 9/2018 | Pathak |

* cited by examiner

*Primary Examiner* — Xiaochun L Chen
(74) *Attorney, Agent, or Firm* — Zagorin Cave LLP

(57) ABSTRACT

A word line driver circuit receives a word line input signal and supplies a word line driver output signal to a worldline. The word line driver circuit includes a transistor having a first current carrying terminal coupled to the word line driver output signal and a second current carrying terminal coupled to a first node. A gate of the transistor is coupled to the word line input signal, and the transistor provides a path from the word line to the first node while the word line is asserted. A programmable word line underdrive circuit is coupled between the first node and a ground node to reduce a voltage on the word line output signal. A plurality of word line driver circuits are coupled to the first node and use the word line underdrive circuit to underdrive their respective word lines.

20 Claims, 3 Drawing Sheets

US 10,541,013 B1

HEADERLESS WORD LINE DRIVER WITH SHARED WORDLINE UNDERDRIVE CONTROL

BACKGROUND

Description of the Related Art

FIG. 1 illustrates a six transistor static random access memory (SRAM) cell that includes two pass transistors 101 and 103 having gates driven by the word line (WL). The memory cell further includes two cross coupled inverters coupled to bit lines 105 and 107 through the pass transistors. The bit lines are pre-charged and have significant capacitance since a large number of memory cells are coupled to the bit lines for density purposes. The WL driver 110 asserting the word line 112 for read operations causes a significant amount of charge to be dumped into the memory cell from the bit lines creating essentially a resistive divider between, e.g., the pass gate 103 and the pull down transistor 109. It is desirable for the pull down transistor 109 to be stronger than the pass gate 103 so that the voltage spike that occurs in the cell is not very high. That is, the resistance of the transistor 109 should be lower than the resistance of the transistor 103. Otherwise, there is a risk that a voltage spike caused by turning on the pass gates for a read operation will flip the value of the cell. Thus, to ensure read stability, a cell read stability enhancing technique Word line Underdrive (WLUD) has been used to ensure that the pass transistors 101 and 103 are not strong relative to the pulldown transistors 109 and 111.

The WLUD technique has used a DC fight between a P-channel field effect transistor (PFET) pullup and an N-channel field effect transistor (NFET) pulldown. Some designs avoid using NFETs to avoid the amount of underdrive being dependent on NFET to PFET strength ratio. Referring to FIG. 2, to avoid a high area overhead, the pullup/pulldown contest has been implemented using a header transistor 201 supplying a set of WL drivers (WLdrv [N:0]) 203 rather than one set of pulldowns per WL driver, where N represents an integer, e.g., 7 or 15. The header PFET transistor 201 contends with PFET pull down transistors 205 affecting the supply voltage supplied to the driver 207 and thus the strength of WLs (WL[N:0]) 209. Separate PFET control lines prog[2], prog[1], prog[0], which are coupled to respective gates of the PFET pulldown transistors 205, control how many of the PFET pulldown transistors are turned on. The more pulldown transistors 205 that are turned on, the more the underdrive for WLs 209.

SUMMARY OF EMBODIMENTS OF THE INVENTION

Embodiments herein provide a word line driver and WLUD circuit that avoids the use of a header and still utilizes a programmable pulldown structure shared by multiple word lines.

In one embodiment an apparatus includes a word line driver circuit that receives a word line input signal and supplies a word line driver output signal to a word line. The word line driver circuit includes a transistor having a first current carrying terminal coupled to the word line driver output signal and a second current carrying terminal coupled to a first node. A gate of the transistor is coupled to the word line input signal, and the transistor provides a path from the word line to the first node while the word line is asserted. A word line underdrive circuit is coupled between the first node and a ground node to reduce a voltage on the word line output signal.

In another embodiment an integrated circuit includes a word line underdrive circuit coupled between a first node and a ground node. A plurality of word line driver circuits receive respective word line input signals and supply word line driver output signals to respective word lines. Each of the word line driver circuits receives one of the word line input signals and supplies one of the word line driver output signals and each of the word line driver circuit includes a transistor having a first current carrying terminal coupled to the one of the word line driver output signals and a second current carrying terminal coupled to the first node and wherein a gate of the transistor is coupled to the one of the word line input signals.

In another embodiment a method includes supplying a word line driver circuit with a word line input signal and supplying a word line driver output signal to a word line from the word line driver circuit. A gate of a transistor is supplied with the word line input signal, the transistor being on while the word line is in an asserted state and the transistor being off while the word line is in a deasserted state. A voltage on the word line is reduced by providing a path from the word line to a ground node through the transistor while the word line is asserted, the path including a word line underdrive circuit coupled between the transistor and the ground node.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

As RC impedance gets worse on integrated circuits, distributing the word line voltage across all the columns of the SRAM is becoming more difficult. One problem is that as CMOS processes continue to scale, source/drain contact resistance of FETs continues to rise. FinFET architectures make that problem significantly worse due to the vertical geometries involved. When a header is introduced, the single power delivery contact actually becomes three series contacts—the source and drain of the header and the source of WL driver pullup. Due to the increased contact resistance, small header structures that are over just a few gates have become a timing and power delivery problem for word line voltages. The problem is that having a fine grain, programmable WLUD voltage with low area overhead generally requires having a header, but having a header can significantly worsen delay through the WL driver.

Figure 3:
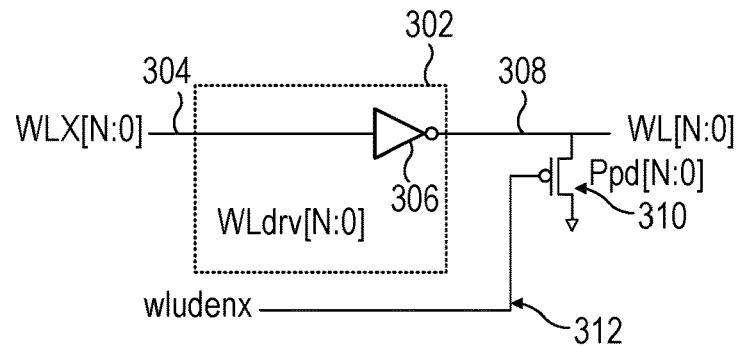
FIG. 3 illustrates an implementation of a headerless WL driver and WLUD circuit.

FIG. 3 illustrates an alternative approach that avoids use of a header. Each of the WL drivers 302 (WLdrv[N:0]) receive one of the inverted WL control signals 304 (WLX[N:0]), where N represents an integer, e.g., 7 or 15 and where the suffix "X" represents an inversion. Each of the drivers includes an inverter 306. Note that only a single driver of the drivers 302 (WLdrv[N:0]) is shown for ease of illustration. Each of the drivers 302 supplies one of the WL signals 308 (WL[N:0]). The N+1 word lines 308 each have one of the P-Channel Field Effect Transistors (PFET) pulldowns 310 Ppd[N:0] (one per word line) controlled by the word line underdrive control signal (wludenx) 312 to pull the WL towards ground when the underdrive control signal turns on the PFET pulldown. PFETs are also referred to herein as PMOS transistors. Note that only a single PFET pulldown of the of the PFET pulldowns 310 (Ppd[N:0]) is shown for ease of illustration. Note also that the control signal wludenx 312 is shared among the pulldown PFETs 310 of multiple word lines or alternatively a separate wludenx 312 is provided for each of the pulldown PFETs 310. The single PFET pulldown per WL utilizes a low area per word line but fails to provide a fine grain, programmable WLUD voltage. To provide programmability, the number of pulldown transistors has to increase per word line leading to increased area and complexity to individually control separate pulldown circuits per word line.

Figure 4:
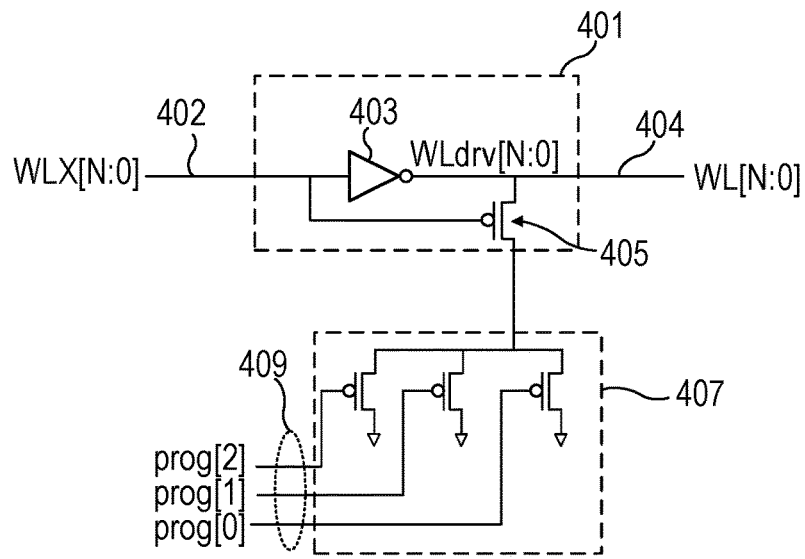
FIG. 4 illustrates an embodiment of a headerless driver and programmable WLUD circuit that is shared across multiple WL drivers.

FIG. 4 illustrates an embodiment of a word line driver and WLUD solution that avoids a header and still utilizes a programmable pulldown structure shared between multiple word lines. The embodiment of FIG. 4 includes the WL drivers 401 that receive the inverted values 402 (WLX[N:0]) of the word line and invert the word line values WLX[N:0] to generate the WL values 404 (WL[N:0]), where N is an integer, e.g., 7 or 15 or represents another number of word lines. Each of the word line drivers 401 includes an inverter 403. Note that only a single driver of the drivers 401 (WLdrv[N:0]) is shown for ease of illustration. Each of the word line drivers 401 further includes a single transistor 405 having a gate that is controlled by the particular WLX[i] signal also supplied to the inverter 403 of the particular word line driver WLdrv[i], where "i" represents one of the integers [N:0]. The transistor 405 connects the WL associated with the driver to a shared pulldown PFET network 407 forming the pulldown path for the active word line. Sharing the pulldown network among multiple word lines allows fine grain programmability while amortizing the area across multiple word lines. The PFETs in the pulldown network 407 can be of different sizes to provide more programmability. While three transistors are shown in FIG. 4, embodiments use any suitable number of transistors to provide the desired programmability. The control lines 409 (prog[2], prog[1], prog[0]) control the strength of the pulldown network. While three control lines 409 are shown, other numbers of control lines are utilized depending on the granularity of the pulldown network utilized. Note while the embodiment of FIG. 4 utilizes PFETs for transistors 405 for the pulldown network 407, other embodiments use N-channel field effect transistors (NFETs) for either transistor 405, the pulldown network 407, or both.

Figure 1:
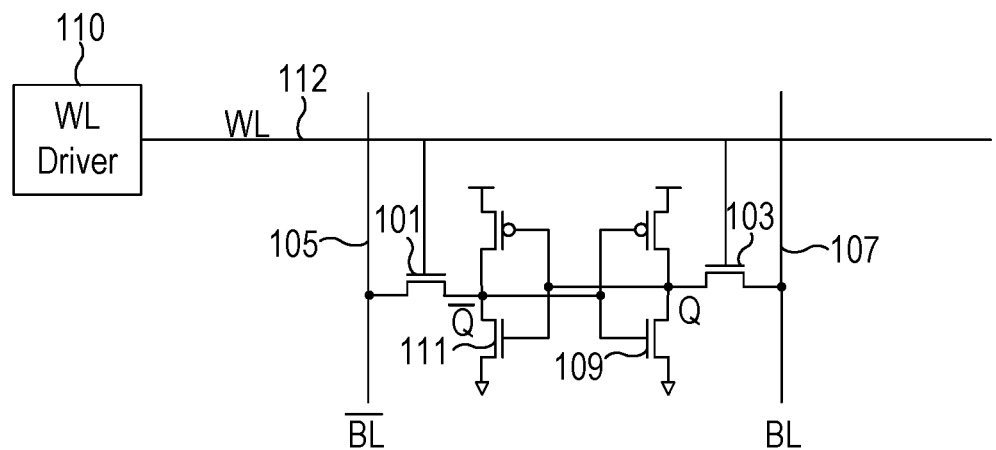
FIG. 1 illustrates an SRAM memory cell.
Figure 2:
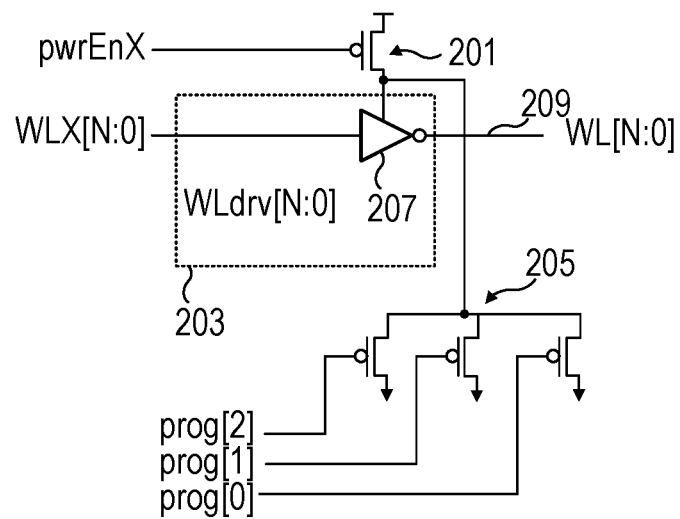
FIG. 2 illustrates an implementation of a WLUD circuit using a header.
Figure 5:
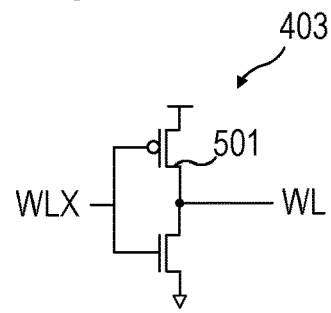
FIG. 5 illustrates an inverter structure of a driver circuit.

The power consumed in the DC contention between the pulldown network 407 and the pullup transistor in the inverter 403 is lower than the approach shown in FIG. 1. The power savings comes because the fight in the embodiment of FIG. 4 is between a single WL driver pullup transistor 501 shown in FIG. 5, which transistor is smaller than the pullup transistor found in header 201 (see FIG. 2). The pullup transistor in header 201 was typically oversized as compared to the drivers. Leakage current could be well controlled through use of the header (by having series transistors both off when SRAM is idle) and not using the header in the embodiment of FIG. 4 loses the leakage current advantage provided by the header but the increased speed resulting from the reduced contact resistance without the header allows use of high threshold voltage (Vt) transistors in the driver and pulldown network. A typical process technology provides multiple Vt levels for transistors, e.g., low, mid, and high Vt transistors. As used herein, a high Vt transistor is the highest Vt device available in the particular process technology. Using high Vt transistors and getting rid of the header results in the leakage current being about equal to the header version shown in FIG. 2 (when all the devices in the driver, header, and pulldown network shown in FIG. 2 are mid-Vt devices). Note that while some embodiments use high Vt transistors in the driver inverter, the transistor between the word line and the pulldown network, and in the pulldown network, other embodiments use mid or low Vt transistors in the driver and pulldown network, or use mixed Vt transistors, e.g., mid and high Vt transistors to bias the fight towards either the driver or the pulldown network.

As shown in FIG. 4, the WLUD circuit 407 is shared among N+1 drivers (WLdrvr[N:0]) with each driver driving one of N+1 word lines (WL[N:0]). While the number N may vary in any particular implementation, in some embodiments, e.g., eight or sixteen word line drivers share a single WLUD circuit.

Figure 6:
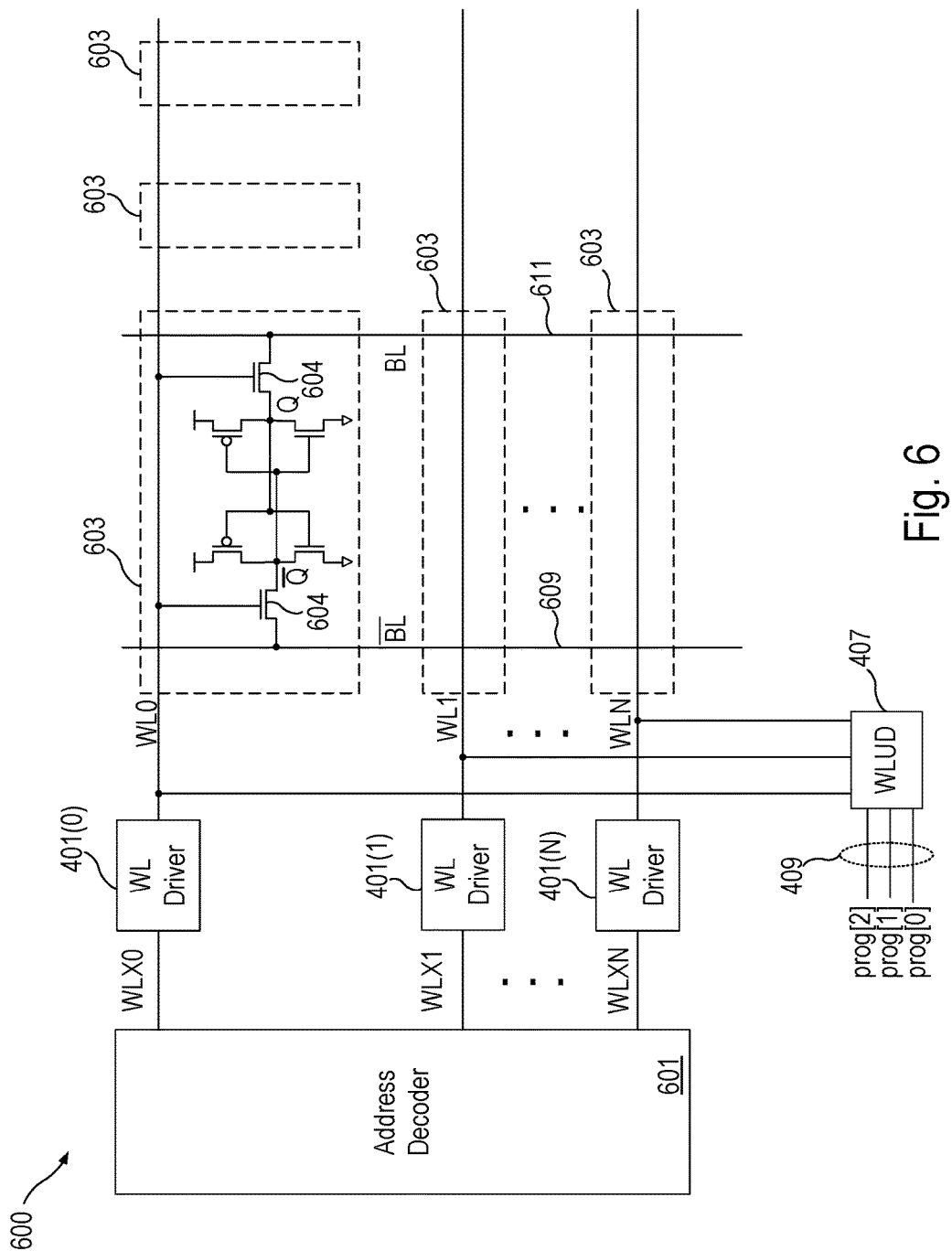
FIG. 6 illustrates a high level block diagram of an embodiment of an SRAM that utilizes a headerless driver and a programmable WLUD circuit that is shared across multiple drivers.

FIG. 6 shows a high level block diagram of an SRAM structure 600 that utilizes the WL driver and WLUD circuit shown in FIG. 4. An address decoder 601 supplies the word line drivers 401(0), 401(1), 401(N) with WLX values WLX0, WLX1, and WLXN. The drivers 401 supply the word lines WL0, WL1, WLN, which in turn are coupled to the pass gates 604 of the memory cells 603 in their row. The bit lines 609 and 611 are coupled to the memory cells of the first SRAM column. The word lines WL0 to WLN share the WLUD circuit 407. While a 6T cell is shown in FIG. 6, the SRAM cell can be formed in other configurations. The SRAM driver and WLUD structure of FIGS. 4 and 6 can be utilized in any integrated circuit that includes SRAM.

Thus, a headerless word line driver that uses a shared WLUD circuit with other headerless word line drivers have been described. The description of the invention set forth herein is illustrative, and is not intended to limit the scope of the invention as set forth in the following claims Variations and modifications of the embodiments disclosed herein, may be made based on the description set forth herein, without departing from the scope of the invention as set forth in the following claims.

What is claimed is:
1. An apparatus comprising:
a word line driver circuit receiving a word line input signal and supplying a word line driver output signal to a word line;
the word line driver circuit further including a transistor having a first current carrying terminal coupled to the word line driver output signal and a second current carrying terminal coupled to a first node; and
wherein a gate of the transistor is coupled to the word line input signal, and wherein the transistor provides a path from the word line to the first node while the word line is asserted; and a word line underdrive circuit coupled between the first node and a supply node to reduce a voltage of the word line driver output signal.

2. The apparatus as recited in claim 1 wherein the word line underdrive circuit comprises a plurality of pull-down transistors coupled in parallel between the first node and a ground node.

3. The apparatus as recited in claim 2, wherein the transistor and the pull-down transistors are high threshold voltage devices.

4. The apparatus as recited in claim 1 where the word line driver circuit includes an inverter.

5. The apparatus as recited in claim 1, wherein the transistor is a PMOS transistor.

6. The apparatus as recited in 2, wherein the pull-down transistors are PMOS transistors.

7. The apparatus as recited in claim 2, further comprising a plurality of control signals respectively supplied to gates of the pull-down transistors to vary a number of the pull-down transistors that are turned on according to the control signals.

8. The apparatus as recited in claim 2, further comprising a plurality of word line driver circuits including the word line driver circuit supplying a respective plurality of word lines to a plurality of memory cells, the plurality of word line driver circuits coupled to the pull-down transistors at the first node.

9. An integrated circuit comprising:
a word line underdrive circuit coupled between a first node and a ground node;
a plurality of word line driver circuits receiving respective word line input signals and supplying word line driver output signals to respective word lines; and
each of the word line driver circuits receiving one of the word line input signals and supplying one of the word line driver output signals and each of the word line driver circuits including a transistor having a first current carrying terminal coupled to the one of the word line driver output signals and a second current carrying terminal coupled to the first node and wherein a gate of the transistor is coupled to receive the one of the word line input signals.

10. The integrated circuit as recited in claim 9, wherein each of the word line driver circuits further comprises an inverter coupled to receive the one of the word line input signals and supply the one of the word line driver output signals.

11. The integrated circuit as recited in claim 10, wherein the word line underdrive circuit comprises a plurality of transistors coupled in parallel between the first node and the ground node.

12. The integrated circuit as recited in claim 11, wherein one or more of the plurality of transistors of the word line underdrive circuit are different in size than at least another of the plurality of transistors.

13. A method comprising:
supplying a word line driver circuit with a word line input signal and supplying a word line driver output signal to a word line from the word line driver circuit;
supplying a gate of a transistor with the word line input signal, the transistor being on while the word line is asserted and the transistor being off while the word line is deasserted; and
reducing a voltage of the word line by providing a path from the word line to a ground node through the transistor while the word line is asserted, the path including a word line underdrive circuit coupled between the transistor and the ground node.

14. The method as recited in claim 13 further comprising varying a number of transistors in the word line underdrive circuit that are turned on to adjust the voltage of the word line according to a plurality of gate control signals supplied to respective ones of the transistors.

15. The method as recited in claim 13, wherein the transistor and transistors of the word line underdrive circuit are PMOS transistors.

16. The method as recited in claim 13, further comprising:
providing a path through another transistor of another driver circuit for another word line from the other word line to the ground node, the path including the word line underdrive circuit to thereby reduce the voltage of the other word line while the other word line is asserted.

17. The method as recited in claim 13, wherein the transistor and transistors of the word line underdrive circuit are high threshold voltage devices.

18. The method as recited in claim 13 further comprising using the word line underdrive circuit to reduce a second word line voltage for a second word line.

19. The method as recited in claim 18 wherein only one of the second word line and the word line are asserted at a time.

20. The method as recited in claim 13 further comprising the word line driver circuit inverting the word line input signal to generate the word line driver output signal.

* * * * *